(12) United States Patent
Liang

(10) Patent No.: US 11,089,245 B2
(45) Date of Patent: Aug. 10, 2021

(54) IMAGE SENSOR CIRCUIT AND IMAGE DEPTH SENSOR SYSTEM

(71) Applicant: SHENZHEN GOODIX TECHNOLOGY CO., LTD., Shenzhen (CN)

(72) Inventor: Yu-An Liang, Taipei (TW)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 588 days.

(21) Appl. No.: 15/813,139

(22) Filed: Nov. 14, 2017

(65) Prior Publication Data

US 2019/0058839 A1 Feb. 21, 2019

Related U.S. Application Data

(63) Continuation of application No. PCT/CN2017/097684, filed on Aug. 16, 2017.

(51) Int. Cl.
| | |
|---|---|
| *H01L 27/00* | (2006.01) |
| *H04N 5/357* | (2011.01) |
| *G01S 7/4914* | (2020.01) |
| *H01L 27/146* | (2006.01) |
| *H04N 5/365* | (2011.01) |
| *G01S 17/894* | (2020.01) |
| *G01J 1/42* | (2006.01) |
| *H04N 5/376* | (2011.01) |

(52) U.S. Cl.
CPC .......... *H04N 5/3577* (2013.01); *G01J 1/4228* (2013.01); *G01S 7/4914* (2013.01); *G01S 17/894* (2020.01); *H01L 27/14603* (2013.01); *H01L 27/14641* (2013.01); *H04N 5/3651* (2013.01); *H04N 5/3765* (2013.01)

(58) Field of Classification Search
CPC .. H04N 5/3577; H04N 5/3651; H04N 5/3765; G01S 7/4914; G01S 17/894; G01S 17/89; G01J 1/4228; H01L 27/14641; H01L 27/14603
USPC ...................................................... 250/208.1
See application file for complete search history.

(56) References Cited

U.S. PATENT DOCUMENTS

| | | | |
|---|---|---|---|
| 9,462,234 B2 * | 10/2016 | Blanquart | .............. A61B 1/051 |
| 2008/0088724 A1 | 4/2008 | Kudoh | |
| 2009/0219424 A1 | 9/2009 | Sonoda et al. | |

(Continued)

FOREIGN PATENT DOCUMENTS

| CN | 1089054 A | 7/1994 |
|---|---|---|
| CN | 102831860 A | 12/2012 |

(Continued)

*Primary Examiner* — Georgia Y Epps
*Assistant Examiner* — Kevin Wyatt
(74) *Attorney, Agent, or Firm* — Scully Scott Murphy & Presser

(57) ABSTRACT

The present disclosure provides an image sensor circuit, including: a pixel array, including a plurality of pixel series, where a pixel series in the plurality of pixel series includes a plurality of pixel circuits; and a clock signal generating circuit, coupled to a first end and a second end of the pixel series; where a first clock signal is propagated from the first end of the pixel series to the second end of the pixel series at a first time; and where a second clock signal is propagated from the second end of the pixel series to the first end of the pixel series.

12 Claims, 5 Drawing Sheets

(56) References Cited

U.S. PATENT DOCUMENTS

| | | | | |
|---|---|---|---|---|
| 2012/0050560 A1* | 3/2012 | Kobayashi | ........... | H04N 5/3742 |
| | | | | 348/222.1 |
| 2015/0188553 A1 | 7/2015 | Familia et al. | | |
| 2015/0221265 A1 | 8/2015 | Huang et al. | | |
| 2016/0073088 A1* | 3/2016 | Cohen | ............... | H01L 27/14607 |
| | | | | 348/46 |
| 2016/0125823 A1 | 5/2016 | Huang et al. | | |
| 2016/0178749 A1* | 6/2016 | Lin | ......................... | G01S 17/89 |
| | | | | 348/302 |
| 2017/0269630 A1* | 9/2017 | Kamezawa | ............... | G06F 1/10 |

FOREIGN PATENT DOCUMENTS

| | | | |
|---|---|---|---|
| CN | 103390392 A | 11/2013 | |
| CN | 103716553 A | 4/2014 | |
| CN | 104113304 A | 10/2014 | |
| CN | 104123923 A | 10/2014 | |
| CN | 104486987 A | 4/2015 | |
| JP | 2008032877 A | 2/2008 | |
| JP | 2010041460 A | 2/2010 | |
| KR | 20110059253 A | 6/2011 | |
| WO | 2016031066 A1 | 3/2016 | |

* cited by examiner

# IMAGE SENSOR CIRCUIT AND IMAGE DEPTH SENSOR SYSTEM

CROSS-REFERENCE TO RELATED APPLICATIONS

The present disclosure is a continuation of international application No. PCT/CN2017/097684, filed on Aug. 16, 2017, of which is hereby incorporated by reference in its entirety.

TECHNICAL FIELD

The present disclosure relates to an image sensor circuit and an image depth sensor system, and in particular, to an image sensor circuit and an image depth sensor system which may reduce an influence caused by phase differences of clock signals.

BACKGROUND

A 3D image sensor circuit may collect distance/depth information thereof with respect to a target object, and thus three dimensional image data is generated by a value of space or a value of distance between respective pixels of a 3D image, and the 3D image is also referred to as a distance image or a depth image. Additional distance dimension may be used in various applications to obtain more information about an object in a scene captured by a camera, thereby solving different tasks in the field of industrial sensors.

Generally, in a 3D image sensor circuit, incident light is emitted by a light emitting diode, a plurality of pixel circuits in a pixel array are used to collect reflected light corresponding to the incident light and reflected from a target object, and then a distance/depth between an electronic device (provided with the 3D image sensor circuit) and the target object may be calculated by comparing an optical path difference between the incident light and the reflected light. However, when the pixel array is large, a clock signal input to the pixel array may generate phase differences in the pixel array, causing that errors are generated when the 3D image sensor circuit calculates the distance/depth between the electronic device and the target object.

Therefore, it is necessary to improve the prior art.

SUMMARY

Therefore, a main objective of the embodiments of the present disclosure is to provide an image sensor circuit and an image depth sensor system which may reduce an influence caused by phase differences of clock signals, so as to improve disadvantages of the prior art.

To solve the foregoing technical problem, an embodiment of the present disclosure provides an image sensor circuit, including: a pixel array, including a plurality of pixel series, where a pixel series in the plurality of pixel series includes a plurality of pixel circuits; and a clock signal generating circuit, coupled to a first end and a second end of the pixel series; where the first end of the pixel series is electrically connected to the clock signal generating circuit to receive a first clock signal at a first time, and the first clock signal is propagated from the first end of the pixel series to the second end of the pixel series; and where the second end of the pixel series is electrically connected to the clock signal generating circuit to receive a second clock signal at a second time, and the second clock signal is propagated from the second end of the pixel series to the first end of the pixel series.

Preferably, the pixel series includes a clock signal transmitting unit, the clock signal transmitting unit being electrically connected to the plurality of pixel circuits in the pixel series.

Preferably, a first end of the clock signal transmitting unit is electrically connected to the clock signal generating circuit to receive the first clock signal at the first time, and the first clock signal is propagated from the first end of the clock signal transmitting unit to a second end of the clock signal transmitting unit; and the second end of the clock signal transmitting unit is electrically connected to the clock signal generating circuit to receive the second clock signal at the second time, and the second clock signal is propagated from the second end of the clock signal transmitting unit to the first end of the clock signal transmitting unit.

Preferably, the clock signal transmitting unit includes at least one buffer module, configured to buffer the first clock signal or the second clock signal transferred in the clock signal transmitting unit.

Preferably, the buffer module includes a plurality of buffers, the plurality of buffers forming a buffer series, where a first buffer in the plurality of buffers is located at a first end of the buffer series, and a second buffer in the plurality of buffers is located at a second end of the buffer series.

Preferably, the buffer module includes a plurality of first switches and a plurality of second switches, the plurality of first switches being electrically connected to input ends of the plurality of buffers respectively, and the plurality of second switches being electrically connected to output ends of the plurality of buffers respectively, where the plurality of first switches are conducted while the plurality of second switches are cutoff at the first time, and the plurality of second switches are conducted while the plurality of first switches are cutoff at the second time.

An embodiment of the present disclosure further provides an image depth sensor system, including: a light emitting unit, configured to emit incident light; and an image sensor circuit, configured to receive reflected light corresponding to the incident light, and including: a pixel array, including a plurality of pixel series, where a pixel series in the plurality of pixel series includes a plurality of pixel circuits; and a clock signal generating circuit, coupled to a first end and a second end of the pixel series; where the first end of the pixel series is electrically connected to the clock signal generating circuit to receive a first clock signal at a first time, and the first clock signal is propagated from the first end of the pixel series to the second end of the pixel series; and where the second end of the pixel series is electrically connected to the clock signal generating circuit to receive a second clock signal at a second time, and the second clock signal is propagated from the second end of the pixel series to the first end of the pixel series.

According to the embodiment of the present disclosure, clock signals propagated in opposite directions are used to form phase differences in pixel circuits of a pixel series at a first time and a second time, and phase differences formed in the pixel circuits of the pixel series at the first time and phase differences formed in the pixel circuits of the pixel series at the second time may compensate each other, so as to solve the disadvantage of an influence of phase differences of clock signals when a depth is calculated in the prior art.

DESCRIPTION OF EMBODIMENTS

To make objectives, technical solutions and advantages of the present disclosure clearer, a further detailed description on the present disclosure will be given below in combination with accompanying drawings and embodiments. It should be understood that, specific embodiments described herein are merely used for illustrating the present disclosure, rather than limiting the present disclosure.

In the description and claims, the term "coupled" refers to any direct or indirect electrical connection means, and the term "electrically connected" refers to a direct electrical connection.

Figure 1:
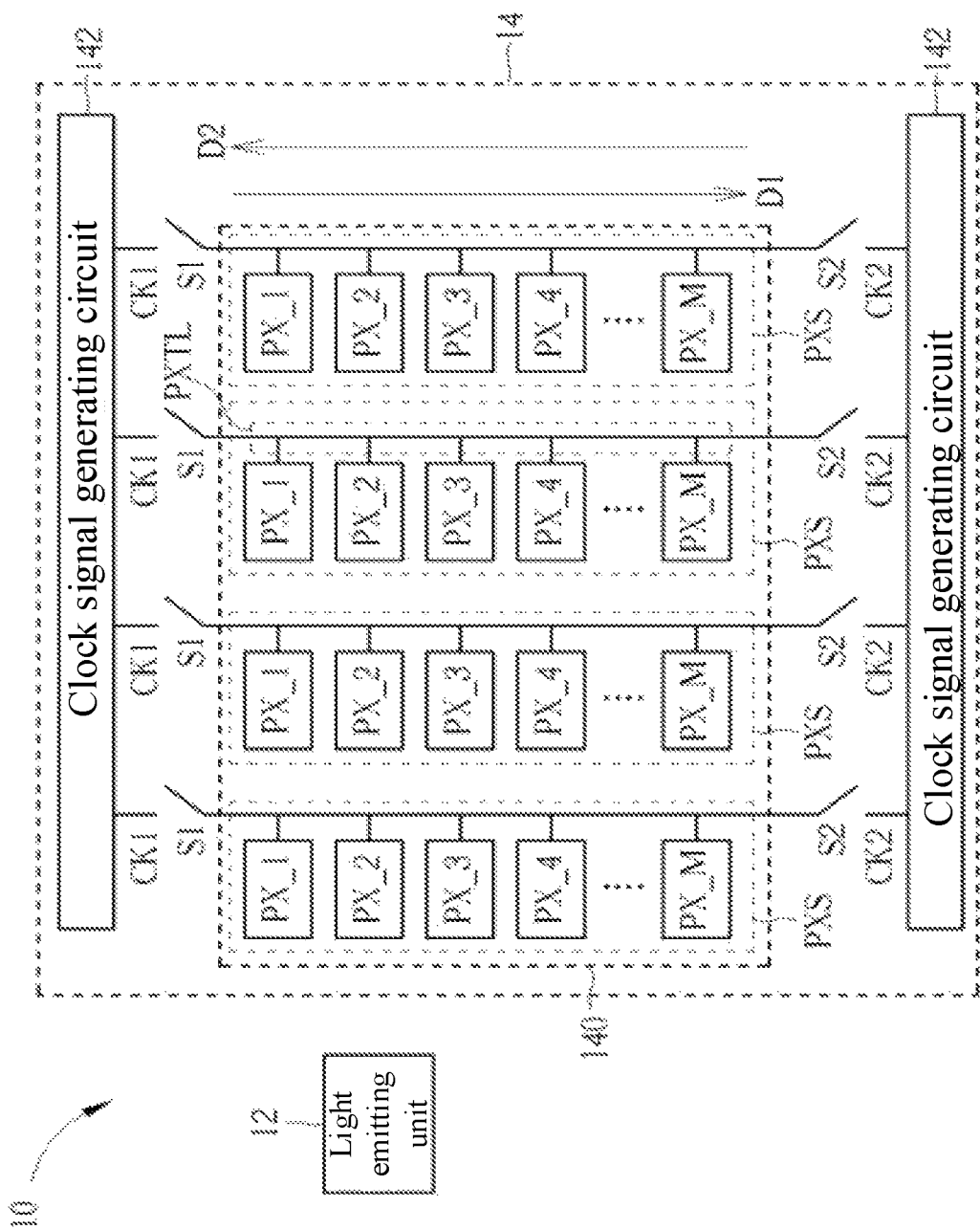
FIG. 1 is a schematic diagram of an image depth sensor system according to an embodiment of the present disclosure;`

Referring to FIG. 1, FIG. 1 is a schematic diagram of an image depth sensor system 10 according to an embodiment of the present disclosure. The image depth sensor system 10 may be a three dimensional image sensor system, and may sense a distance/depth thereof with respect to a target object (not shown in FIG. 1) according to time of flight (ToF) of ray or light to create a three dimensional image of the target object. The image depth sensor system 10 includes a light emitting unit 12 and an image sensor circuit 14, and the light emitting unit 12 may be an invisible light emitting diode (LED), such as an infrared light emitting diode. The light emitting unit 12 is configured to emit incident light, and the image sensor circuit 14 may receive reflected light corresponding to the incident light.

The image sensor circuit 14 includes a pixel array 140 and a clock signal generating circuit 142, the pixel array 140 includes a plurality of pixel series PXSs, a pixel series PXS may be a column or a row of pixels located in the pixel array 140, and the pixel series PXS includes a plurality of pixel circuits PX_1~PX_M, where the pixel circuit PX_1 is a pixel circuit located at a first end (Terminal/End) of the pixel series PXS, the pixel circuit PX_M is a pixel circuit located at a second end of the pixel series PXS, and the clock signal generating circuit 142 is coupled to the first end of the pixel series PXS/pixel circuit PX_1 and the second end of the pixel series PXS/pixel circuit PX_M.

The first end of the pixel series PXS/pixel circuit PX_1 is directly electrically connected to the clock signal generating circuit 142 to receive a first clock signal CK1 at a first time, and the first clock signal CK1 is propagated from the first end of the pixel series PXS/pixel circuit PX_1 to the second end of the pixel series PXS/pixel circuit PX_M. That is to say, the first clock signal CK1 is propagated from the first end of the pixel series PXS/pixel circuit PX_1 to the second end of the pixel series PXS/pixel circuit PX_M in a first direction D1 (for example, in FIG. 1, the first direction D1 is from top to bottom).

The second end of the pixel series PXS/pixel circuit PX_M is directly electrically connected to the clock signal generating circuit 142 to receive a second clock signal CK2 at a second time, and the second clock signal CK2 is propagated from the second end of the pixel series PXS/pixel circuit PX_M to the first end of the pixel series PXS/pixel circuit PX_1. That is to say, the second clock signal CK2 is propagated from the second end of the pixel series PXS/pixel circuit PX_M to the first end of the pixel series PXS/pixel circuit PX_1 in a second direction D2 (for example, in FIG. 1, the second direction D2 is from top to bottom).

Specifically, the pixel series PXS includes a clock signal transmitting unit PXTL. In an embodiment, as shown in FIG. 1, the clock signal transmitting unit PXTL may include metal transmission lines, which are electrically connected to the pixel circuits PX_1~PX_M. A first end of the clock signal transmitting unit PXTL is coupled to the clock signal generating circuit 142 via a switch S1 (that is, the first end of the pixel series PXS/pixel circuit PX_1 is coupled to the clock signal generating circuit 142 via the switch S1), and a second end of the clock signal transmitting unit PXTL is coupled to the clock signal generating circuit 142 via a switch S2 (that is, the second end of the pixel series PXS/pixel circuit PX_M is coupled to the clock signal generating circuit 142 via the switch S2). The switch S1 is conducted while the switch S2 is cutoff at the first time; and the switch S1 is cutoff while the switch S2 is conducted at the second time.

When the switch S1 is conducted at the first time, the first end of the pixel series PXS/pixel circuit PX_1 and the first end of the clock signal transmitting unit PXTL are considered to be directly electrically connected to the clock signal generating circuit 142, the pixel circuit PX_1 and the first end of the clock signal transmitting unit PXTL may receive the first clock signal CK1, and the first clock signal CK1 is carried/conducted in the clock signal transmitting unit PXTL, and is propagated from the pixel circuit PX_1 to the pixel circuit PX_M in the first direction D1.

When the switch S2 is conducted at the second time, the second end of the pixel series PXS/pixel circuit PX_M and the second end of the clock signal transmitting unit PXTL are considered to be directly electrically connected to the clock signal generating circuit 142, the pixel circuit PX_M and the second end of the clock signal transmitting unit PXTL may receive the second clock signal CK2, and the second clock signal CK2 is carried/conducted in the clock signal transmitting unit PXTL, and is propagated from the pixel circuit PX_M to the pixel circuit PX_1 in the second direction D2.

It should be noted that, clock signals actually received by the pixel circuits PX_1~PX_M of the same pixel series PXS (received clock signals for short) have phase differences therebetween since the clock signals conducted in the clock signal transmitting unit PXTL have propagation delay. For the convenience of description, the received clock signals corresponding to the pixel circuits PX_1~PX_M have phase differences $\varphi_{11}$~$\varphi_{1M}$ with respect to the first clock signal CK1 without propagation delay at the first time, and the received clock signals corresponding to the pixel circuits PX_1~PX_M have phase differences $\varphi_{21}$~$\varphi_{2M}$ with respect to the second clock signal CK2 without propagation delay at the second time, where the phase differences $\varphi_{11}$·$\varphi_{1M}$ are related to transmission distances of lines from an output end of the clock signal generating circuit 142 that outputs the first clock signal CK1 to the pixel circuits PX_1~PX_M, the phase differences $\varphi_{21}$~$\varphi_{2M}$ are related to transmission distances of lines from an output end of the clock signal generating circuit 142 that outputs the second clock signal CK2 to the pixel circuits PX_1~PX_M, and there is a relationship of $\varphi_{11}<\varphi_{12}<\varphi_{13}<\ldots<\varphi_{1M}$ among the phase differences $\varphi_1 1$~$\varphi_{1M}$, and there is a relationship of $\varphi_{21}>\varphi_{22}>\varphi_{23}>\ldots>\varphi_{2M}$ among the phase differences $\varphi_{21}$~$\varphi_{2M}$. Preferably, the transmission distances of lines from the output ends of the signal generating circuit 142 that output the first clock signal CK1 and the second clock signal CK2 to the pixel circuit PX_1~PX_M may be designed to make $\varphi_{11}+\varphi_{21}=\varphi_{12}+\varphi_{22}=\ldots=\varphi_{1M}+\varphi_{2M}$, in this way, the phase differences $\varphi_{11}\sim\varphi_{1M}$ and the phase differences $\varphi_{21}\sim\varphi_{2M}$ may compensate each other, and in a long term, an influence of the phase differences $\varphi_{11}\sim\varphi_{1M}$ or the phase differences $\varphi_{21}\sim\varphi_{2M}$ on calculation of a distance/depth may be reduced, thereby reducing errors when the distance/depth is calculated.

Figure 5:
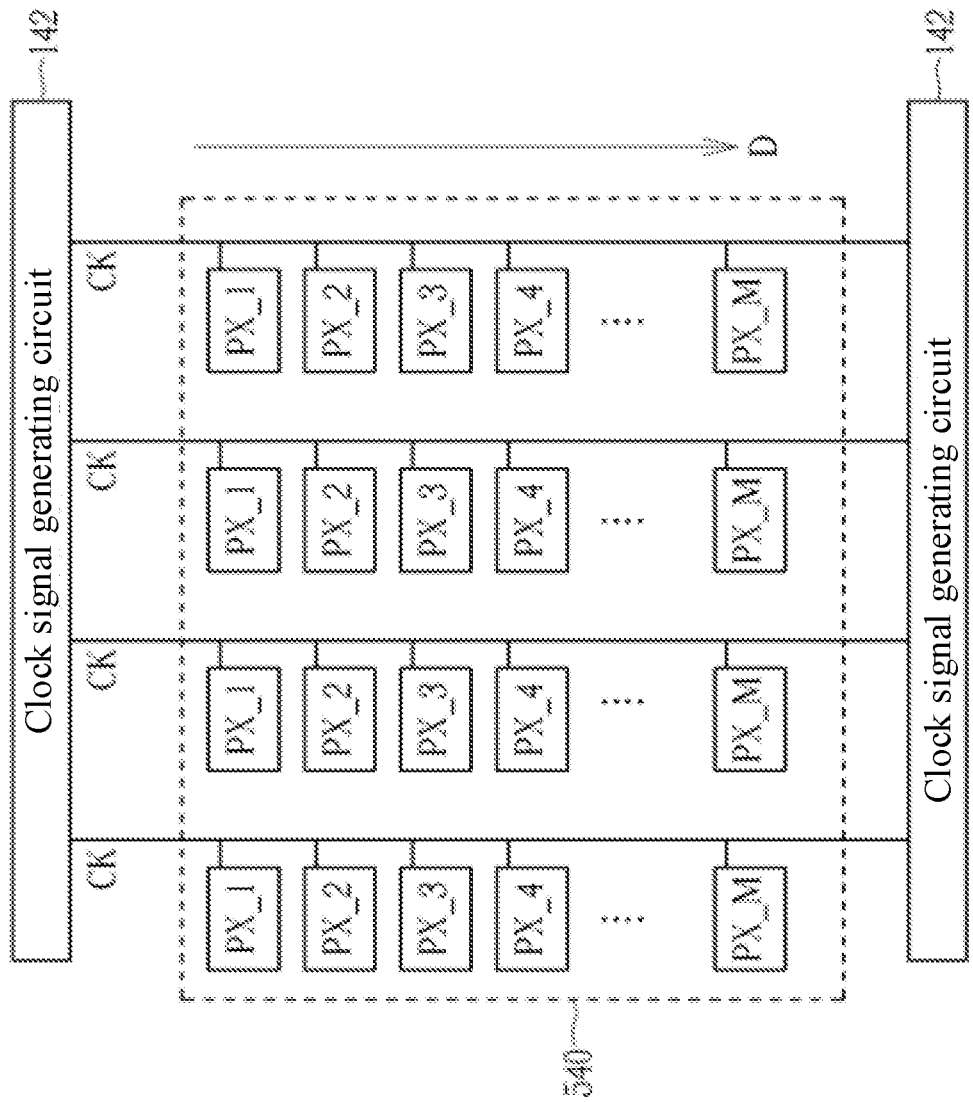
FIG. 5 is a schematic diagram of a pixel array.

By comparison, referring to FIG. 5, FIG. 5 is a schematic diagram of an existing pixel array 540. Clock signals CKs in the pixel array 540 are propagated only in a single direction D, while received clock signals corresponding to pixel circuits PX_1~PX_M have phase differences $\varphi_1\sim\varphi_M$ with respect to the clock signals CKs without propagation delay, and the phase differences $\varphi_1\sim\varphi_M$ may have an influence on calculation of a distance/depth, so as to increase errors when the distance/depth is calculated.

Figure 2:
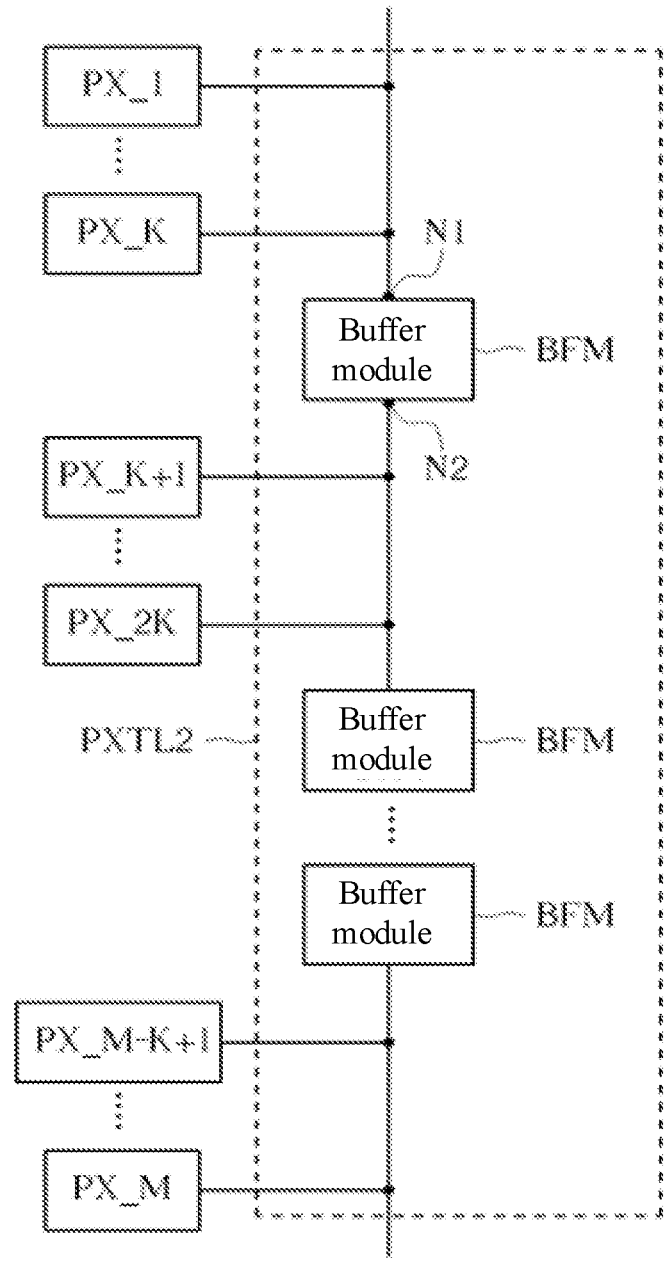
FIG. 2 is a schematic diagram of a clock signal transmitting unit according to an embodiment of the present disclosure.

Further, to make waveforms of a first clock signal CK1 and a second clock signal CK2 more complete during conduction of the first clock signal CK1 and the second clock signal CK2 in a clock signal transmitting unit, the clock signal transmitting unit may include a buffer module. Referring to FIG. 2, FIG. 2 is a schematic diagram of a clock signal transmitting unit PXTL2 according to an embodiment of the present disclosure. The clock signal transmitting unit PXTL2 is an embodiment manner of the clock signal transmitting unit PXTL in FIG. 1, and the clock signal transmitting unit PXTL2 includes a plurality of buffer modules BFMs. In an embodiment, as shown in FIG. 2, the buffer modules BFMs are inserted between every k pixel circuits, but this is not limited thereto. A first clock signal CK1 is received by a first end N1 of a buffer module BFM at a first time, and a second end N2 of the buffer module BFM outputs the buffered first clock signal CK1; and a second clock signal CK2 is received by the second end N2 of the buffer module BFM at a second time, and the first end N1 of the buffer module BFM outputs the buffered second clock signal CK2.

Figure 3:
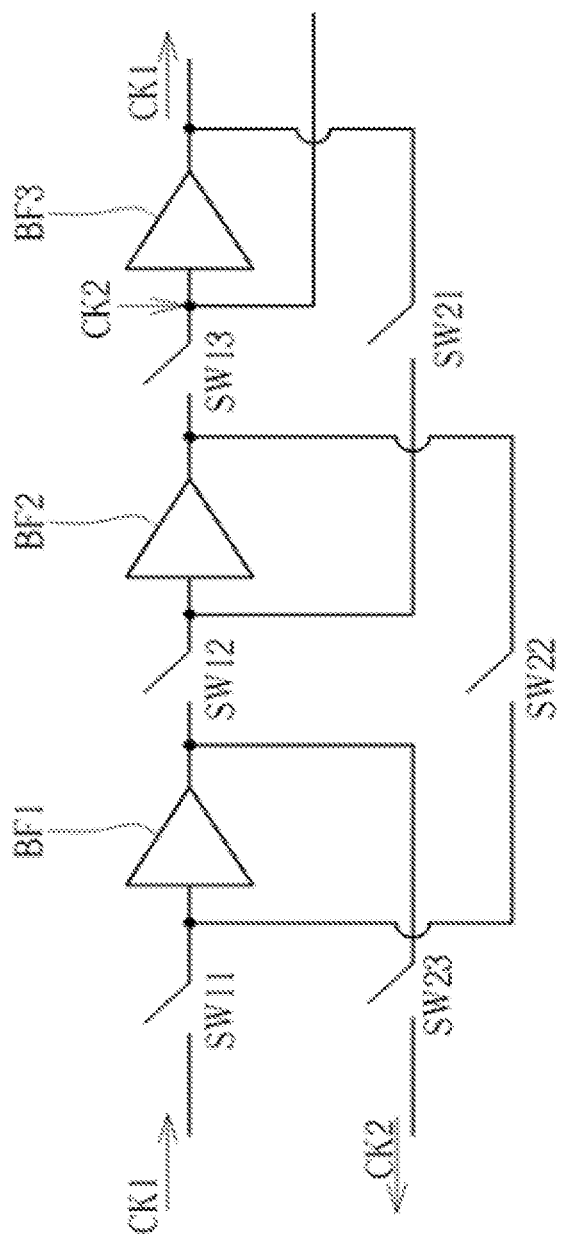
FIG. 3 is a schematic diagram of a buffer module according to an embodiment of the present disclosure.

Specifically, Referring to FIG. 3, FIG. 3 is a schematic diagram of a buffer module BFM according to an embodiment of the present disclosure. The buffer module BFM includes a plurality of buffers BF1, BF2, BF3, first switches SW11, SW12, SW13, and second switches SW21, SW22, SW23, where the first switches SW11, SW12, SW13 are electrically connected to input ends of the buffers BF1, BF2, BF3 respectively, and the second switches SW21, SW22, SW23 are electrically connected to output ends of the buffers BF3, BF2, BF1 respectively. Further, the first switch SW12 is electrically connected between the output end of the buffer BF1 and the input end of the buffer BF2, the first switch SW13 is electrically connected between the output end of the buffer BF2 and the input end of the buffer BF3, the second switch SW21 is electrically connected between the output end of the buffer BF3 and the input end of the buffer BF2, and the second switch SW22 is electrically connected between the output end of the buffer BF2 and the input end of the buffer BF1.

The first switches SW11, SW12, SW13 are conducted and the second switches SW21, SW22, SW23 are cutoff at a first time, and a first clock signal CK1 is input to the buffer module BFM through the first switch SW11 and is output from the input end of the buffer BF3; and the first switches SW11, SW12, SW13 are cutoff and the second switches SW21, SW22, SW23 are conducted at a second time, and a second clock signal CK2 is input to the buffer module BFM from the input end of the buffer BF3 and is output through the second switch SW23.

From the foregoing description, it can be seen that an image sensor circuit 14 has phase differences $\varphi_{11}\sim\varphi_{1M}$ in pixel circuits PX_1~PX_M at the first time, and has phase differences $\varphi_{21}\sim\varphi_{2M}$ in the pixel circuits PX_1~PX_M at the second time using the first clock signal CK1 propagated in a first direction D1 and the second clock signal CK2 propagated in the second direction D2. Preferably, transmission distances of lines from output ends of a signal generating circuit 142 that output the first clock signal CK1 and the second clock signal CK2 to the pixel circuits PX_1~PX_M may be adjusted to make $\varphi_{11}+\varphi_{21}=\ldots=\varphi_{1M}+\varphi_{2M}$, the phase differences $\varphi_{11}\sim\varphi_{1M}$ and the phase differences $\varphi_{21}\sim\varphi_{2M}$ may compensate each other, and an influence of the phase differences $\varphi_{11}\sim\varphi_{1M}$ or the phase differences $\varphi_{21}\sim\varphi_{2M}$ on calculation of a distance/depth may be reduced, thereby reducing errors when the distance/depth is calculated.

It should be noted that the foregoing embodiment is used for illustrating concepts of the present disclosure, persons with ordinary knowledge in the art can make different modifications according to these, but this is not limited thereto. For example, a clock signal transmitting unit is not limited to including a plurality of buffer modules, and the clock signal transmitting unit may only include one buffer module, which is also within the scope of the present disclosure. Furthermore, the buffer module is not limited to including three buffers, the buffer module may include a plurality of buffers, and it is possible to satisfy requirements of the present disclosure as long as first switches and second switches are used at a suitable time to switch transmission paths of the first clock signal CK1 and the second clock signal CK2 in the buffer module.

Figure 4:
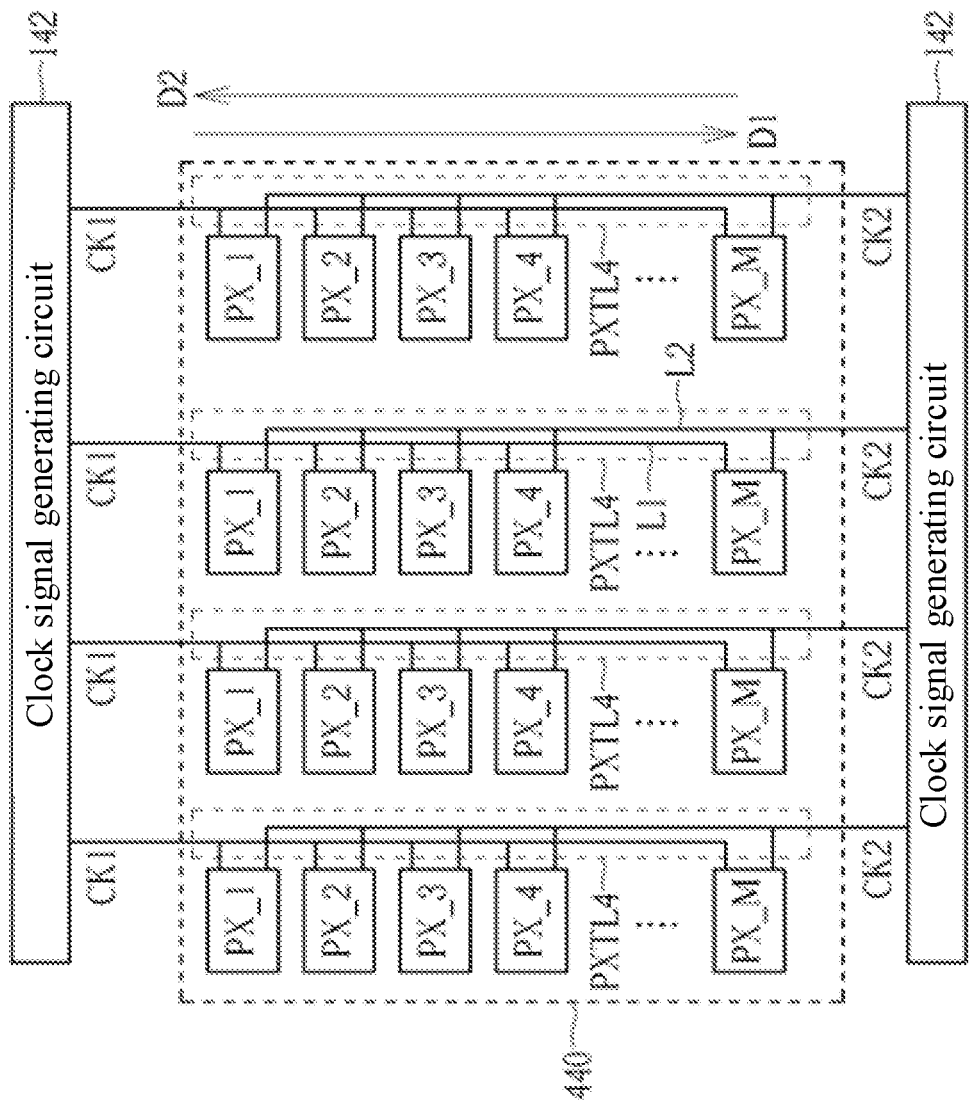
FIG. 4 is a schematic diagram of a pixel array according to an embodiment of the present disclosure.

Furthermore, referring to FIG. 4, FIG. 4 is a schematic diagram of a pixel array 440 according to an embodiment of the present disclosure. The pixel array 440 is similar to the pixel array 140, therefore, the same components follow the same marks. Unlike the pixel array 140, a clock signal transmitting unit PXTL4 in the pixel array 440 includes metal transmission lines L1, L2, and the metal transmission lines L1, L2 are directly electrically connected to pixel circuits PX_1~PX_M, the metal transmission line L1 is used to conduct a first clock signal CK1, and the metal transmission line L2 is used to conduct a second clock signal CK2. In other words, the first clock signal CK1 is carried/conducted in the metal transmission line L1 at a first time, and is propagated from the pixel circuit PX_1 to the pixel circuit PX_M in a first direction D1; and the second clock signal CK2 is carried/conducted in the metal transmission line L2 at a second time, and is propagated from the pixel circuit PX_M to the pixel circuit PX_1 in a second direction D2, which also belongs to the scope of the present disclosure.

To sum up, according to the present disclosure, clock signals propagated in opposite directions are used to form phase differences in pixel circuits of a pixel series at a first time and a second time, and phase differences formed in the pixel circuits of the pixel series at the first time and phase differences formed in the pixel circuits of the pixel series at the second time may compensate each other, so as to reduce an influence of the phase differences on calculation of a distance/depth, thereby reducing errors when the distance/depth is calculated.

The foregoing descriptions are merely preferred embodiments of the present disclosure, rather than limiting the present disclosure, and any modifications, equivalent substitutions, improvements and the like, made within the spirit and principle of the present disclosure, are all encompassed in the protection scope of the present disclosure.

What is claimed is:

1. An image sensor circuit, comprising:
   a pixel array, comprising a plurality of pixel series, wherein a pixel series in the plurality of pixel series comprises a plurality of pixel circuits, the plurality of pixel circuits are used to collect reflected light corresponding to incident light emitted by a light emitting unit and reflected from a target object; and
   two clock signal generating circuits, the first clock signal generation circuit of the two clock signal generation circuits is coupled to the first end of the pixel series, and the second clock signal generation circuit of the two clock signal generation circuits is coupled to the second end of the pixel series;
   wherein the first end of the pixel series is electrically connected to the first clock signal generating circuit to receive a first clock signal at a first time, and the first clock signal is propagated from the first end of the pixel series to the second end of the pixel series, wherein each pixel circuit is used to determine a first time of flight of received reflected light according to the received first clock signal; and
   wherein the second end of the pixel series is electrically connected to the second clock signal generating circuit to receive a second clock signal at a second time, and the second clock signal is propagated from the second end of the pixel series to the first end of the pixel series, wherein each pixel circuit is used to determine a second time of flight of received reflected light according to the received second clock signal.

2. The image sensor circuit according to claim 1, wherein the pixel series comprises a clock signal transmitting unit, the clock signal transmitting unit being electrically connected to the plurality of pixel circuits in the pixel series.

3. The image sensor circuit according to claim 2, wherein a first end of the clock signal transmitting unit is electrically connected to the first clock signal generating circuit to receive the first clock signal at the first time, and the first clock signal is propagated from the first end of the clock signal transmitting unit to a second end of the clock signal transmitting unit; and the second end of the clock signal transmitting unit is electrically connected to the second clock signal generating circuit to receive the second clock signal at the second time, and the second clock signal is propagated from the second end of the clock signal transmitting unit to the first end of the clock signal transmitting unit.

4. The image sensor circuit according to claim 2, wherein the clock signal transmitting unit comprises at least one buffer module, configured to buffer the first clock signal or the second clock signal transferred in the clock signal transmitting unit.

5. The image sensor circuit according to claim 4, wherein the buffer module comprises a plurality of buffers, the plurality of buffers forming a buffer series, wherein a first buffer in the plurality of buffers is located at a first end of the buffer series, and a second buffer in the plurality of buffers is located at a second end of the buffer series.

6. The image sensor circuit according to claim 5, wherein the buffer module comprises a plurality of first switches and a plurality of second switches, the plurality of first switches being electrically connected to input ends of the plurality of buffers respectively, and the plurality of second switches being electrically connected to output ends of the plurality of buffers respectively, wherein the plurality of first switches are conducted while the plurality of second switches are cutoff at the first time, and the plurality of second switches are conducted while the plurality of first switches are cutoff at the second time.

7. An image depth sensor system, comprising:
   a light emitting unit, configured to emit incident light; and
   an image sensor circuit, configured to receive reflected light corresponding to the incident light, and comprising:
   a pixel array, comprising a plurality of pixel series, wherein a pixel series in the plurality of pixel series comprises a plurality of pixel circuits, the plurality of pixel circuits are used to collect the reflected light; and
   two clock signal generating circuits, the first clock signal generation circuit of the two clock signal generation circuits is coupled to the first end of the pixel series, and the second clock signal generation circuit of the two clock signal generation circuits is coupled to the second end of the pixel series;
   wherein the first end of the pixel series is electrically connected to the first clock signal generating circuit to receive a first clock signal at a first time, and the first clock signal is propagated from the first end of the pixel series to the second end of the pixel series, wherein each pixel circuit is used to determine a first time of flight of received reflected light according to the received first clock signal; and
   wherein the second end of the pixel series is electrically connected to the second clock signal generating circuit to receive a second clock signal at a second time, and the second clock signal is propagated from the second end of the pixel series to the first end of the pixel series, wherein each pixel circuit is used to determine a second time of flight of received reflected light according to the received second clock signal.

8. The image depth sensor system according to claim 7, wherein the pixel series comprises a clock signal transmitting unit, the clock signal transmitting unit being electrically connected to the plurality of pixel circuits in the pixel series.

9. The image depth sensor system according to claim 8, wherein a first end of the clock signal transmitting unit is electrically connected to the first clock signal generating circuit to receive the first clock signal at the first time, and the first clock signal is propagated from the first end of the clock signal transmitting unit to a second end of the clock signal transmitting unit; and the second end of the clock signal transmitting unit is electrically connected to the second clock signal generating circuit to receive the second clock signal at the second time, and the second clock signal is propagated from the second end of the clock signal transmitting unit to the first end of the clock signal transmitting unit.

10. The image depth sensor system according to claim 8, wherein the clock signal transmitting unit comprises at least one buffer module, configured to buffer the first clock signal or the second clock signal transferred in the clock signal transmitting unit.

11. The image depth sensor system according to claim 10, wherein the buffer module comprises a plurality of buffers, the plurality of buffers forming a buffer series, wherein a first buffer in the plurality of buffers is located at a first end of the buffer series, and a second buffer in the plurality of buffers is located at a second end of the buffer series.

12. The image depth sensor system according to claim 11, wherein the buffer module comprises a plurality of first switches and a plurality of second switches, the plurality of first switches being electrically connected to input ends of the plurality of buffers respectively, and the plurality of second switches being electrically connected to output ends of the plurality of buffers respectively, wherein the plurality of first switches are conducted while the plurality of second switches are cutoff at the first time, and the plurality of second switches are conducted while the plurality of first switches are cutoff at the second time.

* * * * *